(12) United States Patent
Son et al.

(10) Patent No.: US 11,915,905 B2
(45) Date of Patent: Feb. 27, 2024

(54) SUPPORT UNIT AND SUBSTRATE TREATING APPARATUS INCLUDING THE SAME

(71) Applicant: SEMES CO., LTD., Cheonan-si (KR)

(72) Inventors: Hyoungkyu Son, Seoul (KR); Yu Dong Han, Daejeon (KR); Hyeon Gyu Kim, Cheonan-si (KR); Seon Ok Kim, Asan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 214 days.

(21) Appl. No.: 16/918,299

(22) Filed: Jul. 1, 2020

(65) Prior Publication Data

US 2021/0005419 A1    Jan. 7, 2021

(30) Foreign Application Priority Data

Jul. 2, 2019  (KR) .......... 10-2019-0079203

(51) Int. Cl.
*H01J 37/32* (2006.01)
*H01L 21/683* (2006.01)
*H01J 37/20* (2006.01)

(52) U.S. Cl.
CPC ........ *H01J 37/20* (2013.01); *H01J 37/32082* (2013.01); *H01J 37/32532* (2013.01); *H01J 37/32715* (2013.01); *H01L 21/683* (2013.01); *H01J 2237/334* (2013.01)

(58) Field of Classification Search
CPC ... H01L 21/683; H01J 2237/334; H01J 37/20; H01J 37/32082; H01J 37/32532; H01J 37/32715

USPC ..................................... 156/345.35
See application file for complete search history.

(56) References Cited

U.S. PATENT DOCUMENTS

| | | | | |
|---|---|---|---|---|
| 5,603,446 A | * | 2/1997 | Kikuchi | .......... H01L 24/78 228/6.2 |
| 8,519,724 B2 | * | 8/2013 | Kim | .......... G01R 27/2623 156/345.47 |
| 2002/0046810 A1 | * | 4/2002 | Tanaka | .......... C23C 16/4401 156/345.51 |
| 2004/0163593 A1 | * | 8/2004 | Aota | .......... H01J 37/32174 118/723 E |
| 2008/0277064 A1 | * | 11/2008 | Kim | .......... H01J 37/32091 156/345.38 |

(Continued)

FOREIGN PATENT DOCUMENTS

| | | |
|---|---|---|
| KR | 2009-0104783 A | 10/2009 |
| KR | 2010-0045979 A | 5/2010 |
| KR | 2019-0028355 A | 3/2019 |

OTHER PUBLICATIONS

Office Action for Korean Application No. 10-2019-0079203 dated Sep. 15. 2020.

*Primary Examiner* — Charlee J. C. Bennett
(74) *Attorney, Agent, or Firm* — Harness, Dickey & Pierce, P.L.C.

(57) ABSTRACT

A support unit provided in an apparatus for treating a substrate using plasma includes a dielectric plate on which the substrate is placed, an electrode plate disposed under the dielectric plate, a power supply rod that applies power to the electrode plate, and a flange that has a shape surrounding the power supply rod and that is spaced apart from the power supply rod.

15 Claims, 8 Drawing Sheets

(56) References Cited

U.S. PATENT DOCUMENTS

| | | | |
|---|---|---|---|
| 2009/0126634 A1* | 5/2009 | Yamazawa | H01J 37/32568 |
| | | | 118/723 R |
| 2009/0242132 A1 | 10/2009 | Sato | |
| 2009/0242135 A1* | 10/2009 | Koshimizu | H01J 37/32091 |
| | | | 156/345.48 |
| 2010/0243609 A1* | 9/2010 | Yamazawa | H01J 37/32697 |
| | | | 156/345.44 |

* cited by examiner

SUPPORT UNIT AND SUBSTRATE TREATING APPARATUS INCLUDING THE SAME

CROSS-REFERENCE TO RELATED APPLICATIONS

A claim for priority under 35 U.S.C. § 119 is made to Korean Patent Application No. 10-2019-0079203 filed on Jul. 2, 2019, in the Korean Intellectual Property Office, the entire contents of which are hereby incorporated by reference.

BACKGROUND

Embodiments of the inventive concept described herein relate to a support unit and a substrate treating apparatus including the support unit.

Plasma is generated by heating a neutral gas to a very high temperature or subjecting the neutral gas to a strong electric field or a radio frequency (RF) electromagnetic field and refers to an ionized gaseous state of matter containing ions, electrons, and radicals. Semiconductor element manufacturing processes may include an etching process, an ashing process, and the like that use plasma. A process of treating a substrate, such as a wafer, using plasma is performed by collision of ions and radicals contained in the plasma with the substrate.

Figure 1:
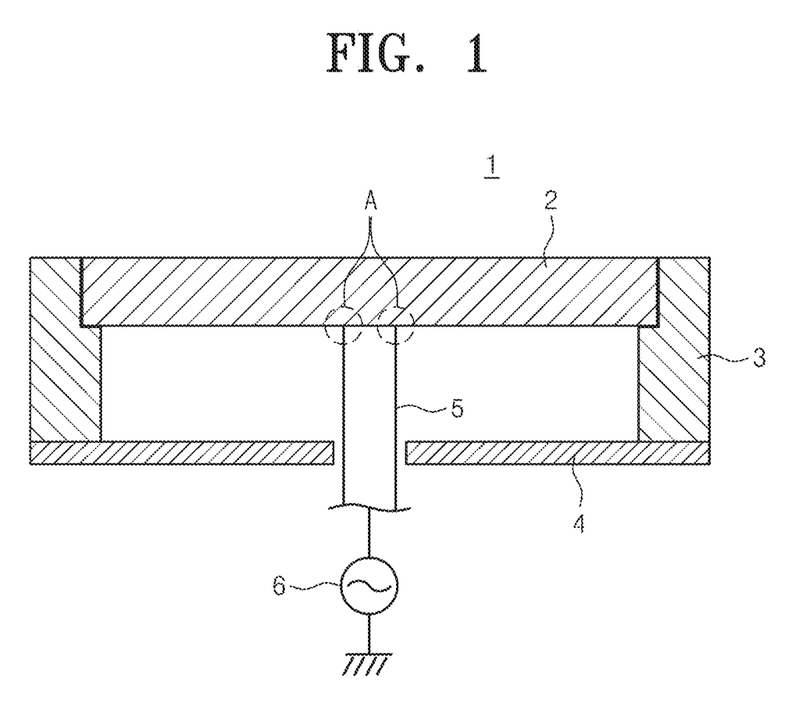
FIG. 1 is a view illustrating part of an electrostatic chuck provided in an apparatus for treating a substrate using plasma.

In general, an apparatus for treating a substrate using plasma includes an electrode and a lower electrode so as to excite a gas into plasma. For example, as illustrated in FIG. 1, a general apparatus for treating a substrate using plasma includes an electrostatic chuck 1 that supports the substrate. The electrostatic chuck 1 includes a lower electrode 2, an insulating member 3, and a conductive member 4. The conductive member 4 is grounded. The lower electrode 2 is coupled with an RF rod 5. The lower electrode 2 is electrically connected with the RF rod 5. The RF rod 5 is connected with a power supply 6. The power supply 6 applies RF power to the RF rod 5. That is, the RF rod 5 applies the RF power to the lower electrode 2. In general, the substrate is supported on the lower electrode 2. That is, the lower electrode 2 may allow plasma to be generated above the substrate. RF current flows through the RF rod 5 connected to the power supply 6. The RF current flows along the surface of the RF rod 5. Dispersion of an electric field occurs in an area A where the RF rod 5 and the lower electrode 2 make contact with each other. Due to the dispersion of the electric field, the RF current transferred to the lower electrode 2 is differently transferred to regions of the lower electrode 2 when viewed from above. Therefore, an electric field is not uniformly generated above the substrate. Accordingly, the uniformity of plasma generated above the substrate is lowered, which causes deterioration in efficiency in treating the substrate.

SUMMARY

Embodiments of the inventive concept provide a support unit for efficiently treating a substrate and a substrate treating apparatus including the support unit.

Furthermore, embodiments of the inventive concept provide a support unit for minimizing dispersion of an electric field in an area where an electrode plate and a power supply rod are connected with each other and a substrate treating apparatus including the support unit.

In addition, embodiments of the inventive concept provide a support unit for providing an additional control factor in adjusting the density of plasma generated above a substrate and a substrate treating apparatus including the support unit.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, a support unit provided in an apparatus for treating a substrate using plasma includes a dielectric plate on which the substrate is placed, an electrode plate disposed under the dielectric plate, a power supply rod that applies power to the electrode plate, and a flange that has a shape surrounding the power supply rod and that is spaced apart from the power supply rod.

According to an embodiment, the flange may be grounded.

According to an embodiment, the flange may be provided to surround part of the power supply rod and may be moved in an up-down direction by a lifting member.

According to an embodiment, the lifting member may include a cylinder including a cam shaft movable in a first direction and a roller shaft that makes contact with the cam shaft and that is movable in a second direction different from the first direction by movement of the cam shaft.

According to an embodiment, the flange may be coupled with the roller shaft.

According to an embodiment, the lifting member may include a rack that is connected with an actuator and that is movable in a first direction and a pinion that is engaged with the rack and that is movable in a second direction different from the first direction by movement of the rack.

According to an embodiment, the lifting member may further include a lifting shaft that is connected to the pinion and that extends in the second direction, and the flange may be connected with the lifting shaft.

According to an embodiment, the rack may have a shape upwardly inclined with respect to the first direction.

According to an embodiment, the lifting member may include a motor including a drive shaft, a pair of bevel gears connected with the drive shaft, and a lifting shaft that moves in the up-down direction by rotation of the pair of bevel gears.

According to an embodiment, the flange may have a cylindrical shape that is open at the top and the bottom.

According to an embodiment, the flange may include a first body and a second body extending from a lower end of the first body in a lateral direction.

According to an embodiment, the flange may be formed of a conductive material.

According to an exemplary embodiment, an apparatus for treating a substrate includes a chamber having a treatment space therein, a support unit that supports the substrate in the treatment space, a gas supply unit that supplies a gas into the treatment space, and a plasma source that generates plasma from the gas. The support unit includes a dielectric plate on which the substrate is placed, an electrode plate disposed under the dielectric plate, a power supply rod that applies power to the electrode plate, and a flange that has a shape surrounding the power supply rod and that is spaced apart from the power supply rod.

According to an embodiment, the chamber may be grounded, and the flange may be electrically connected with the chamber.

According to an embodiment, the chamber and the flange may be formed of a conductive material.

According to an embodiment, the flange may be provided to surround part of the power supply rod and may be moved in an up-down direction by a lifting member.

According to an embodiment, the apparatus may further include a controller that controls the support unit, and the controller may control the lifting member to adjust a distance between an upper surface of the flange and a lower surface of the electrode plate depending on an etch rate required for the substrate treated by the plasma.

According to an embodiment, when increasing the etch rate for the substrate treated by the plasma, the controller may control the lifting member to increase the distance between the upper surface of the flange and the lower surface of the electrode plate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

The inventive concept may, however, be embodied in different forms and should not be construed as limited to the embodiments set forth herein. Rather, these embodiments are provided so that the inventive concept will be thorough and complete, and will fully convey the scope of the inventive concept to those skilled in the art. In the drawings, the dimensions of components are exaggerated for clarity of illustration.

In an embodiment of the inventive concept, a substrate treating apparatus for etching a substrate using plasma will be described. Without being limited thereto, however, the inventive concept is applicable to various types of apparatuses for performing a process by supplying plasma into a chamber.

Figure 2:
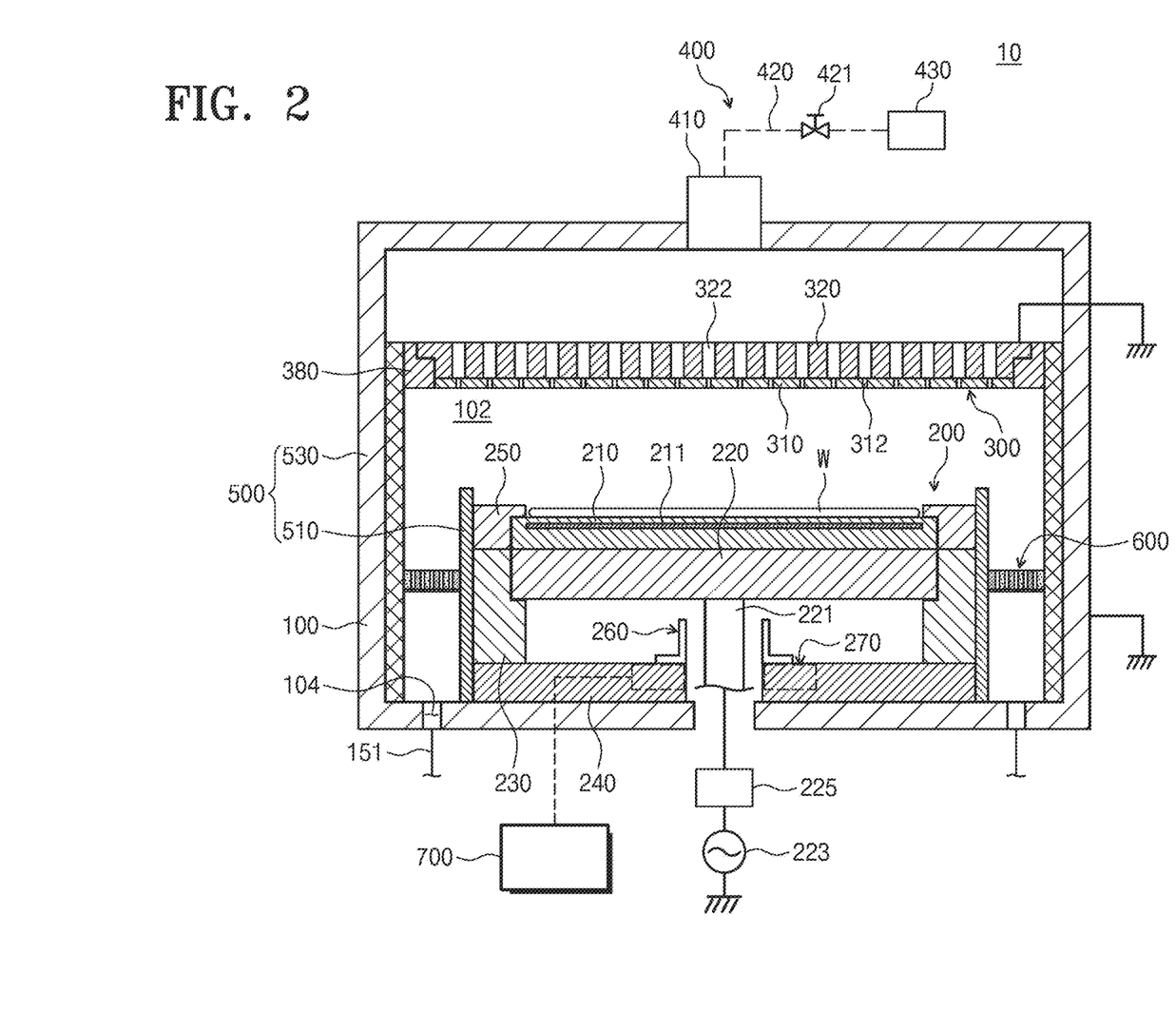
FIG. 2 is a view illustrating a substrate treating apparatus according to an embodiment of the inventive concept.

FIG. 2 is a sectional view illustrating the substrate treating apparatus according to the embodiment of the inventive concept. Referring to FIG. 2, the substrate treating apparatus 10 treats a substrate W using plasma. The substrate treating apparatus 10 includes a chamber 100, a support unit 200, a showerhead unit 300, a gas supply unit 400, a plasma source, a liner unit 500, a baffle unit 600, and a controller 700.

The chamber 100 has a treatment space 102 therein in which a substrate treating process is performed. The chamber 100 is provided in an enclosed shape. The chamber 100 may be formed of a conductive material. For example, the chamber 100 may be formed of a material containing metal. The chamber 100 may be formed of an aluminum material. The chamber 100 may be grounded. The chamber 100 has an exhaust hole 104 formed in the bottom thereof. The exhaust hole 104 is connected with an exhaust line 151. The exhaust line 151 is connected with a pump (not illustrated). Reaction byproducts generated in the substrate treating process and gases staying in the interior space of the chamber 100 may be released to the outside through the exhaust line 151. The pressure in the chamber 100 is reduced to a predetermined pressure by the exhaust process. Alternatively, a separate pressure-reducing member (not illustrated) may be provided to reduce the pressure in the treatment space 102 to the predetermined pressure.

A heater (not illustrated) is provided in a wall of the chamber 100. The heater heats the wall of the chamber 100. The heater is electrically connected with a heating power supply (not illustrated). The heater generates heat by resisting electric current applied by the heating power supply. The heat generated from the heater is transferred to the interior space. The temperature in the treatment space 102 is maintained at a predetermined temperature by the heat generated from the heater. The heater is implemented with a heating wire in a coil shape. A plurality of heaters may be provided in the wall of the chamber 100.

The support unit 200 is located in the chamber 100. The support unit 200 supports the substrate W in the treatment space 102. The support unit 200 may be implemented with an electrostatic chuck that clamps the substrate W using an electrostatic force. The support unit 200 includes a dielectric plate 210, an electrode plate 220, a lower cover 230, a lower support member 240, a ring member 250, a flange 260, and a lifting member 270.

The substrate W is placed on the dielectric plate 210. The dielectric plate 210 has a circular plate shape. The dielectric plate 210 may be formed of a dielectric substance. The dielectric plate 210 receives external power and exerts an electrostatic force on the substrate W. The dielectric plate 210 is equipped with an electrostatic electrode 211. The electrostatic electrode 211 is electrically connected with a clamping power supply 213. The clamping power supply 213 includes a DC power supply. A switch (not illustrated) may be installed between the electrostatic electrode 211 and the clamping power supply 213. The electrostatic electrode 211 may be electrically connected with the clamping power supply 213 by turning on/off the switch. When the switch is turned on, DC current is applied to the electrostatic electrode 211. An electrostatic force acts between the electrostatic electrode 211 and the substrate W by the current applied to the electrostatic electrode 211. The substrate W may be clamped and/or fixed to the dielectric plate 210 by the electrostatic force.

The electrode plate 220 is provided under the dielectric plate 210. An upper surface of the electrode plate 220 may be brought into contact with a lower surface of the dielectric plate 210. The electrode plate 220 may have a circular plate shape. The electrode plate 220 is formed of a conductive material. For example, the electrode plate 220 may be formed of an aluminum material. Furthermore, a fluid channel (not illustrated) for controlling the temperature of the electrode plate 220 to a predetermined temperature may be formed in the electrode plate 220. A cooling fluid may flow through the fluid channel.

A power supply rod 221 may apply power to the electrode plate 220. The power supply rod 221 may be electrically connected with the electrode plate 220. The power supply rod 221 may be connected with a lower power supply 223. The lower power supply 223 may be implemented with a high-frequency power supply that generates high-frequency power. The high-frequency power supply may be implemented with an RF power supply. The RF power supply may be a high bias power RF power supply. The power supply rod 221 receives RF power from the lower power supply 223. The electrode plate 220 electrically connected with the power supply rod 221 may function as a lower electrode. The power supply rod 221 may be formed of a conductive material. For example, the power supply rod 221 may be formed of a material containing metal. The power supply rod 221 may be a metal rod. Furthermore, the power supply rod 221 may be connected with a matcher 225. The power supply rod 221 may be connected with the lower power supply 223 via the matcher 225. The matcher 225 may perform impedance matching.

The lower cover 230 supports the electrode plate 220. The lower cover 230 may be provided to make contact with a side surface of the electrode plate 220. The lower cover 230 may be provided to make contact with an edge region of a lower surface of the electrode plate 220. For example, the lower cover 230 may have a cylindrical shape that is open at the top and the bottom. Furthermore, the lower cover 230 may have a step on the inside thereof such that the electrode plate 220 is supported by the lower cover 230. The lower cover 230 may be formed of an insulating material.

The lower support member 240 is disposed under the lower cover 230. The lower support member 240 is disposed under the lower cover 230 to support the lower cover 230. The lower support member 240 may be formed of a conductive material. For example, the lower support member 240 may be formed of a material containing metal. Furthermore, the lower support member 240 may be electrically connected with the chamber 100.

The ring member 250 is disposed on an edge region of the support unit 200. The ring member 250 has a ring shape. The ring member 250 may be provided to surround an edge region of an upper surface of the dielectric plate 210. Furthermore, the ring member 250 may be provided to surround a side surface of the dielectric plate 210. Moreover, the ring member 250 may be disposed on an upper surface of the lower cover 230. The ring member 250 may be provided as a focus ring.

Figure 3:
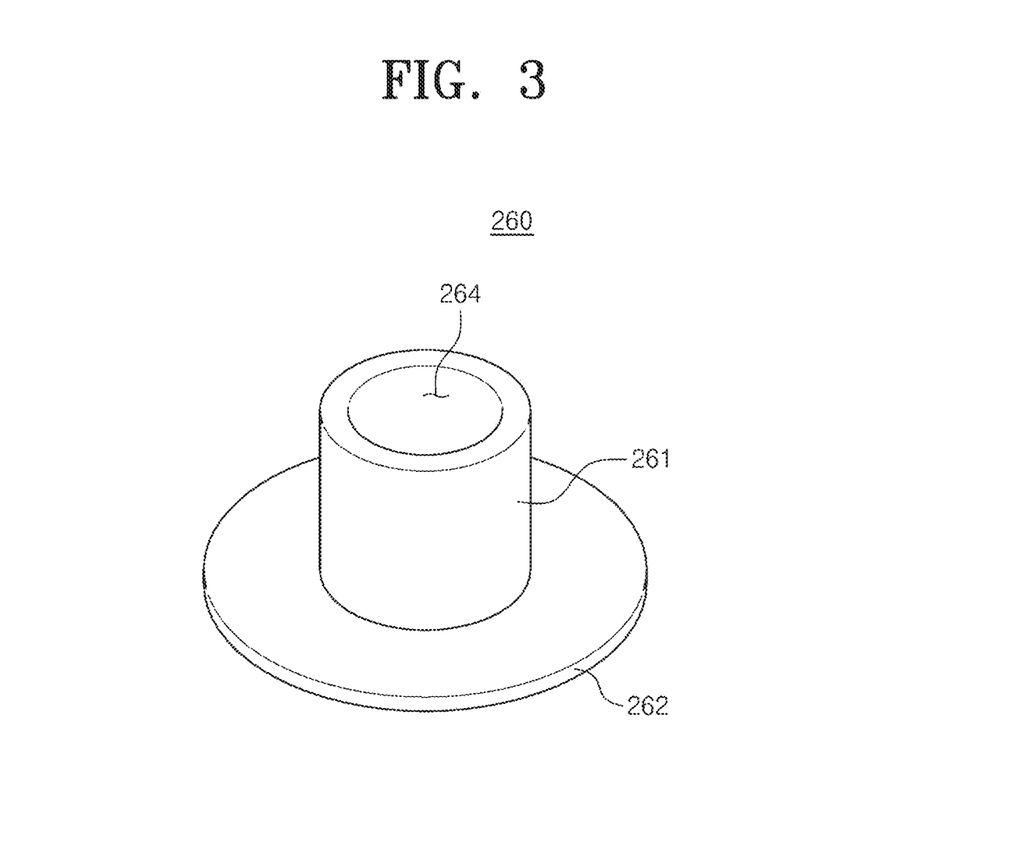
FIG. 3 is a view illustrating a flange of FIG. 2.

The flange 260 is provided to surround the power supply rod 221. The flange 260 may be provided to surround part of the power supply rod 221. That is, the flange 260 has a shape that surrounds the power supply rod 221. Furthermore, the flange 260 is provided to be spaced apart from the power supply rod 221. Referring to FIG. 3, the flange 260 may have a cylindrical shape that is open at the top and the bottom. The flange 260 may include a first body 261 and a second body 262. The first body 261 may have a cylindrical shape that is open at the top and the bottom. The second body 262 may extend from a lower end of the first body 261 in a lateral direction. The first body 261 and the second body 262 may have a ring shape when viewed from above. The flange 260 may have an insertion hole 264 formed therein. Part of the power supply rod 221 may be inserted into the insertion hole 264.

Referring again to FIG. 2, the flange 260 may be formed of a conductive material. The flange 260 may be formed of a material containing metal. The flange 260 may be grounded. For example, the flange 260 may be electrically connected with the lower support member 240. Furthermore, the lower support member 240 may be electrically connected with the chamber 100. The chamber 100 may be grounded. That is, the flange 260 may be grounded by being electrically connected with the chamber 100.

The lifting member 270 may vertically move the flange 260. The lifting member 270 may adjust the distance between an upper surface of the flange 260 and the lower surface of the electrode plate 220 by vertically moving the flange 260. Furthermore, the lifting member 270 may receive a control signal output by the controller 700, which will be described below, and may vertically move the flange 260. The lifting member 270 may be provided in the lower support member 240.

Figure 4:
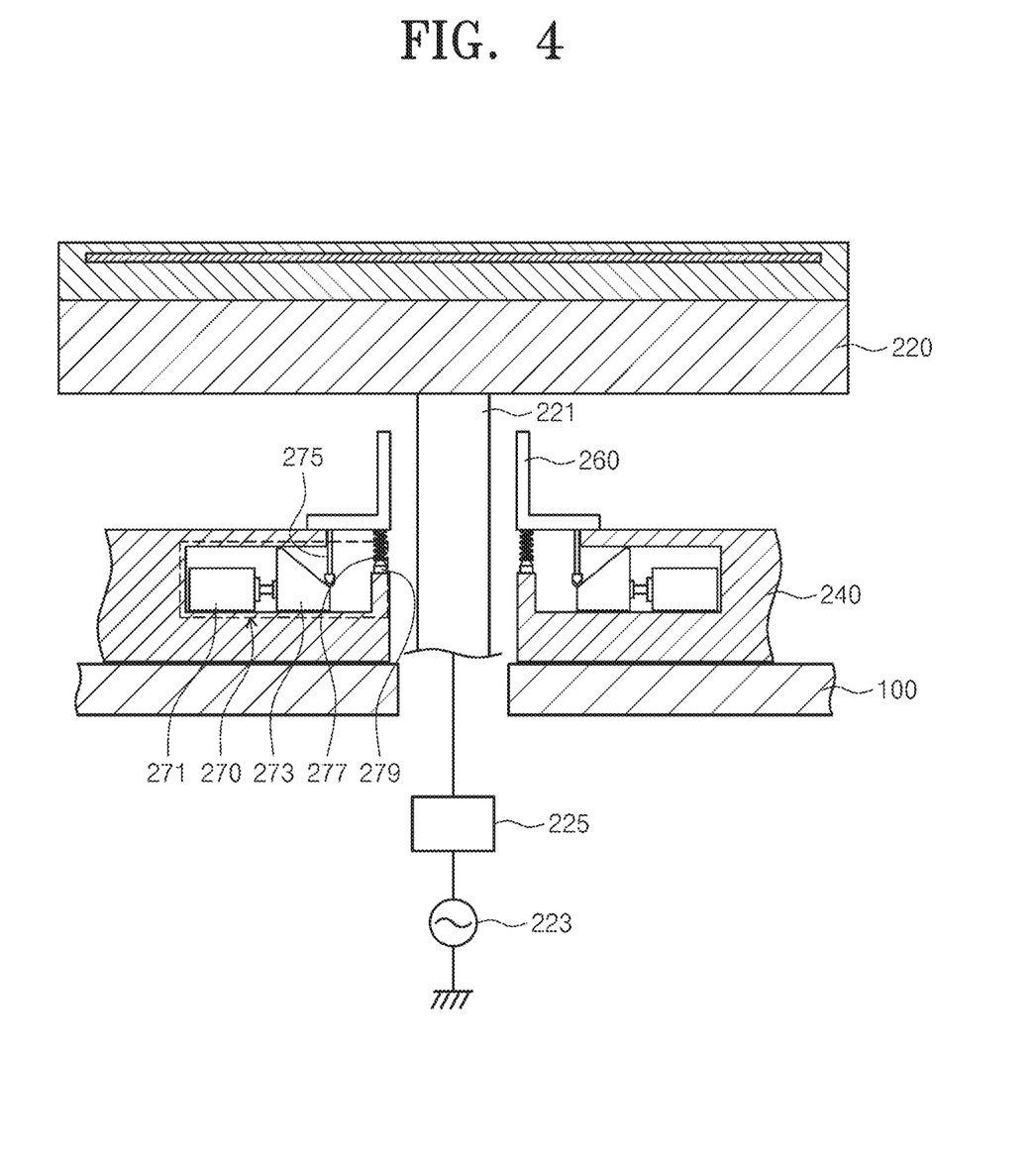
FIG. 4 is a view illustrating a lifting member of FIG. 2.

FIG. 4 is a view illustrating the lifting member of FIG. 2. Referring to FIG. 4, the lifting member 270 may include a cylinder 271, a cam shaft 273, a roller shaft 275, an elastic body 277, and a shock-absorbing pin 279. The cylinder 271 may include the cam shaft 273. The cam shaft 273 has a shape in which an upper surface of a head is inclined. The cylinder 271 may move the cam shaft 273 in a first direction by air pressure or hydraulic pressure. Without being limited thereto, however, the cylinder 271 may be implemented with various well-known cylinders. The roller shaft 275 may have a roller at one end thereof. The one end of the roller shaft 275, at which the roller is provided, may make contact with the cam shaft 273. Specifically, the one end of the roller shaft 275, at which the roller is provided, may make contact with the upper surface of the cam shaft 273. An opposite end of the roller shaft 275 may be coupled to the flange 260. The cam shaft 273 may be moved along the first direction by air pressure or hydraulic pressure applied by the cylinder 271, and the roller shaft 273 making contact with the cam shaft 273 may be moved in a second direction different from the first direction. The second direction may be a direction perpendicular to the first direction. As the roller shaft 275 is moved in the second direction, the flange 260 coupled with the roller shaft 275 may be vertically moved.

The elastic body 277 may be provided on a lower surface of the flange 260. The elastic body 277 may be implemented with a spring. Furthermore, the shock-absorbing pin 279 may be provided on the lower support member 240. The shock-absorbing pin 279 may be disposed to correspond to the position in which the elastic body 277 is provided on the flange 260. The elastic body 277 and the shock-absorbing pin 279 may prevent the flange 260 from colliding with the lower support member 240 while vertically moving.

Figure 5:
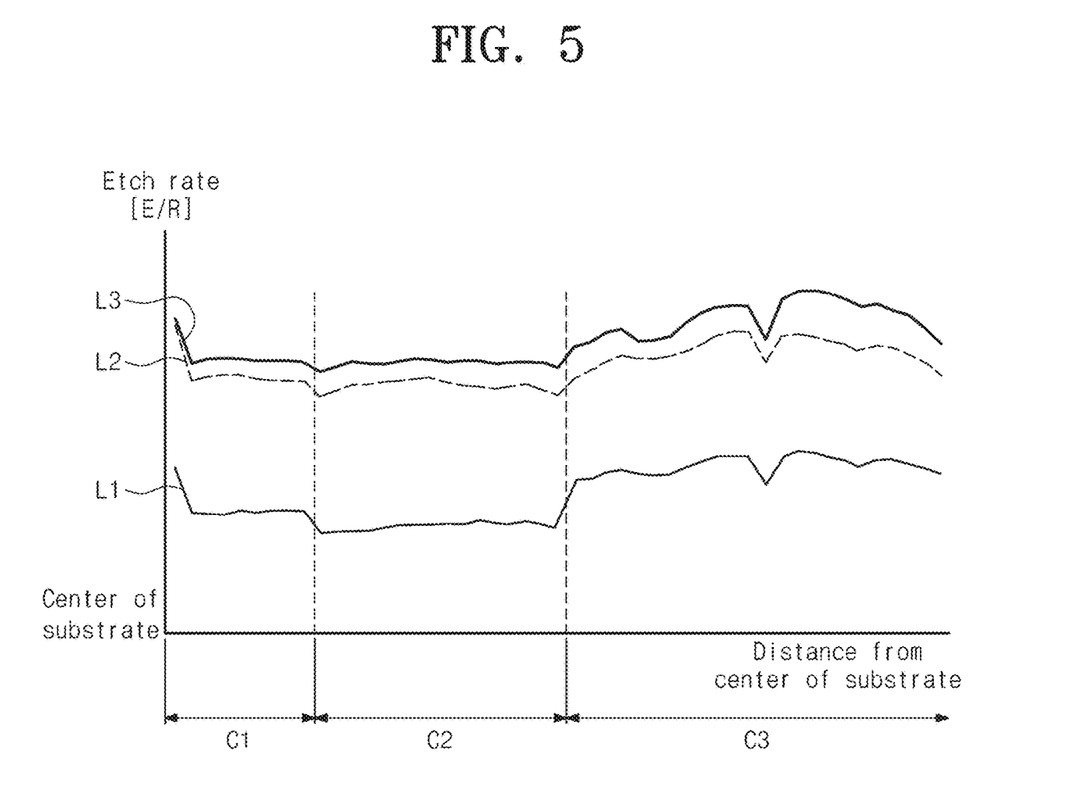
FIG. 5 illustrates substrate etch rates depending on a presence or absence of the flange and the distance between the flange and an electrode plate.

FIG. 5 illustrates substrate etch rates depending on a presence or absence of the flange and the distance between the flange and the electrode plate. Referring to FIG. 5, when viewed from above, a substrate may be divided into a central region C1, a middle region C2, and an edge region C3 depending on the distance from the center of the substrate. FIG. 5 illustrates substrate etch rates by plasma depending on a first condition L1, a second condition L2, and a third condition L3. The first condition L1 is an etch rate in a case where the flange 260 is not provided. The second condition L2 is an etch rate in a case where the flange 260 is provided and the upper surface of the flange 260 and the lower surface of the electrode plate 220 are spaced apart from each other at a first interval. The third condition L3 is an etch rate in a case where the flange 260 is provided and the upper surface of the flange 260 and the lower surface of the electrode plate 220 are spaced apart from each other at a second interval. The first interval may be smaller than the second interval.

Comparing the etch rate in the first condition L1 and the etch rate in the second condition L2, it can be seen that the difference in etch rate between the central region C1, the middle region C2, and the edge region C3 in the first condition L1 is greater than the difference in etch rate between the central region C1, the middle region C2, and the edge region C3 in the second condition L2. That is, as the flange 260 is provided, an electric field is generated between the upper surface of the flange 260 and the lower surface of the electrode plate 220. The generated electric field is generated in a relatively small interval. That is, the electric field generated between the upper surface of the flange 260 and the lower surface of the electrode plate 220 interrupts dispersion of an electric field in the area where the power supply rod 221 and the electrode plate 220 are connected with each other. Accordingly, a relatively uniform electric field is formed above the electrode plate 220, and the density of plasma generated above the electrode plate 220 becomes uniform. As the density of the plasma generated above the substrate becomes uniform, an etch rate for the substrate also becomes uniform.

Figure 6:
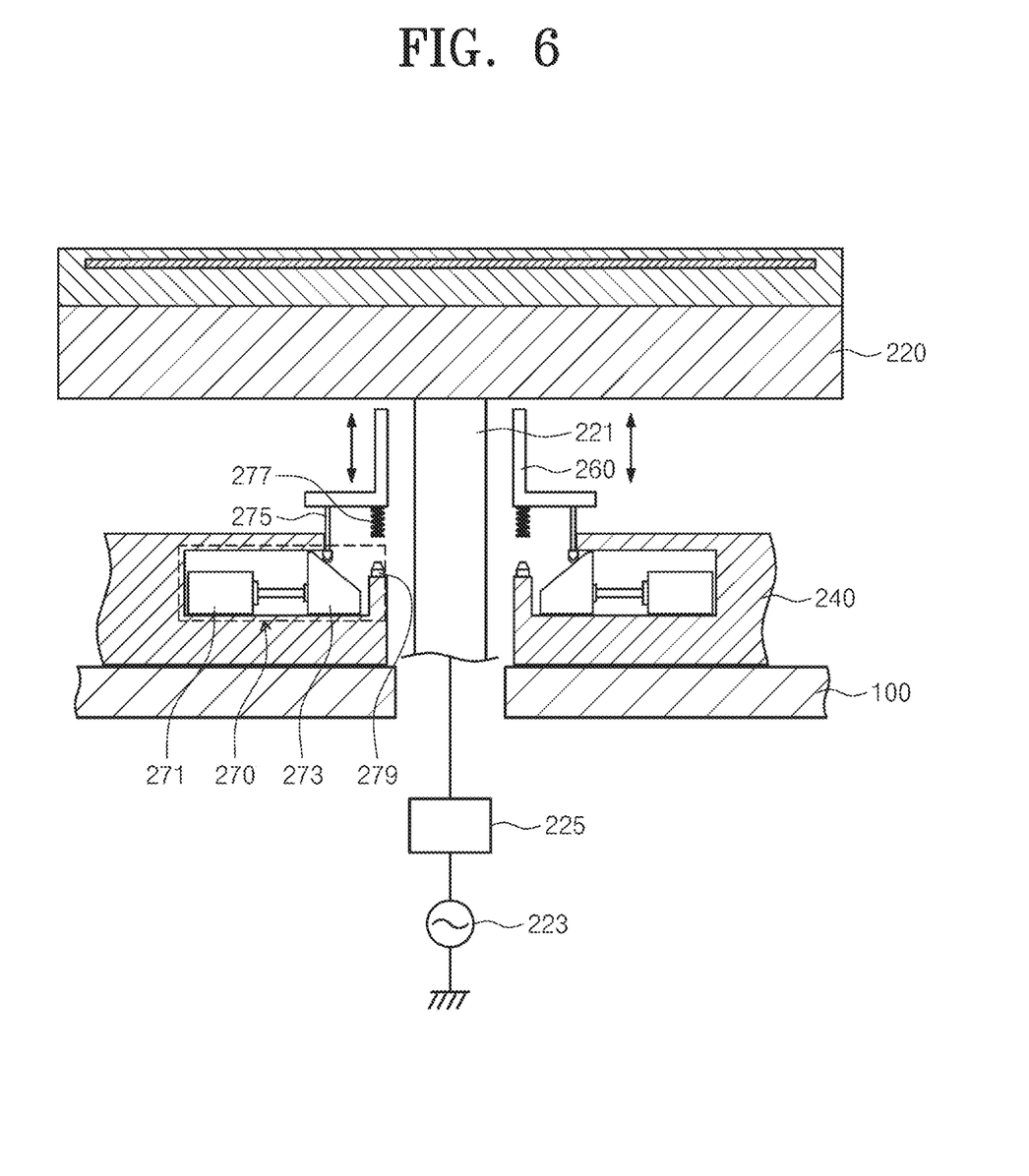
FIG. 6 is a view illustrating a state in which the flange of FIG. 2 moves upward or downward.

Comparing the etch rate in the second condition L2 and the etch rate in the third condition L3, it can be seen that the etch rate in the second condition L2 is lower than the etch rate in the third condition L3. According to an embodiment of the inventive concept, as illustrated in FIG. 6, an etch rate for a substrate may be adjusted by raising or lowering the flange 260. As the flange 260 is vertically moved, the interval between the flange 260 and the electrode plate 220 is changed. That is, impedance between the flange 260 and the electrode plate 220 is adjusted, and the phase of the impedance is changed. Accordingly, the etch rate for the substrate may be adjusted. The controller 700 may control the lifting member 270 to adjust the distance between the upper surface of the flange 260 and the lower surface of the electrode plate 220 depending on an etch rate required for the substrate treated by plasma. For example, when increasing the etch rate for the substrate treated by the plasma, the controller 700 may control the lifting member 270 to increase the distance between the upper surface of the flange 260 and the lower surface of the electrode plate 220. That is, the embodiment of the inventive concept may provide an additional factor capable of adjusting the etch rate for the substrate.

Referring again to FIG. 2, the showerhead unit 300 may disperse a gas supplied from above. Furthermore, the showerhead unit 300 may allow the gas supplied by the gas supply unit 400 to be uniformly supplied into the treatment space 102. The showerhead unit 300 includes a showerhead 310 and a gas distribution plate 320.

The showerhead 310 is disposed under the gas distribution plate 320. The showerhead 310 is spaced apart downward from the top of the chamber 100 by a predetermined distance. The showerhead 310 is located over the support unit 200. A predetermined space is formed between the showerhead 310 and the top of the chamber 100. The showerhead 310 may be provided in a plate shape having a constant thickness. A bottom surface of the showerhead 310 may be anodized to prevent an electric arc caused by plasma. A section of the showerhead 310 may have the same shape and cross-sectional area as that of the support unit 200. A plurality of gas supply holes 312 are formed in the showerhead 310. The gas supply holes 312 may be vertically formed through upper and lower surfaces of the showerhead 310.

The showerhead 310 may be formed of a material that generates a compound by reacting with plasma generated from the gas supplied by the gas supply unit 400. For example, the showerhead 310 may be formed of a material that generates a compound by reacting with ions having the highest electro-negativity among ions contained in the plasma. For example, the showerhead 310 may be formed of a material containing silicon (Si).

The gas distribution plate 320 is disposed on the top of the showerhead 310. The gas distribution plate 320 is spaced apart downward from the top of the chamber 100 by a predetermined distance. The gas distribution plate 320 may diffuse the gas supplied from above. Gas introduction holes 322 may be formed in the gas distribution plate 320. The gas introduction holes 322 may be formed in positions corresponding to the gas supply holes 312 described above. The gas introduction holes 322 may be connected with the gas supply holes 312. The gas supplied from above the showerhead unit 300 may sequentially pass through the gas introduction holes 322 and the gas supply holes 312 and may be supplied below the showerhead 310. The gas distribution plate 320 may contain a metallic material. The gas distribution plate 320 may be grounded. The gas distribution plate 320 may function as an upper electrode by being grounded.

An insulating ring 380 is disposed to surround the peripheries of the showerhead 310 and the gas distribution plate 320. The insulating ring 380 may be provided in a circular ring shape as a whole. The insulating ring 380 may be formed of a non-metallic material.

The gas supply unit 400 supplies the gas into the chamber 100. The gas supplied by the gas supply unit 400 may be excited into plasma by the plasma source. The gas supplied by the gas supply unit 400 may be a gas containing fluorine. For example, the gas supplied by the gas supply unit 400 may be carbon tetrafluoride.

The gas supply unit 400 includes a gas supply nozzle 410, a gas supply line 420, and a gas reservoir 430. The gas supply nozzle 410 is installed in a central portion of the top of the chamber 100. The gas supply nozzle 410 has an injection opening formed in the bottom thereof. A process gas is supplied into the chamber 100 through the injection opening. The gas supply line 420 connects the gas supply nozzle 410 and the gas reservoir 430. The gas supply line 420 supplies the process gas stored in the gas reservoir 430 to the gas supply nozzle 410. A valve 420 is installed in the gas supply line 421. The valve 421 opens or closes the gas supply line 420 and adjusts the flow rate of the process gas supplied through the gas supply line 420.

The plasma source excites the process gas in the chamber 100 into plasma. In an embodiment of the inventive concept, a capacitively coupled plasma (CCP) source is used as the plasma source. The capacitively coupled plasma source may include an upper electrode and a lower electrode in the chamber 100. The upper electrode and the lower electrode may be disposed in the vertical direction in the chamber 100 so as to be parallel to each other. One of the opposite electrodes may apply RF power, and the other may be grounded. An electric field may be formed in a space between the opposite electrodes, and the process gas supplied into the space may be excited into plasma. A process of treating the substrate W is performed by using the plasma. According to an embodiment, the upper electrode may be provided as the showerhead unit 300, and the lower electrode may be provided as the electrode plate 220. RF power may be applied to the lower electrode, and the upper electrode may be grounded. Alternatively, RF power may be applied to both the upper electrode and the lower electrode. Due to this, an electric field is generated between the upper electrode and the lower electrode. The generated electric field excites the process gas in the chamber 100 into plasma.

The liner unit 500 prevents an inner wall of the chamber 100 and the support unit 200 from being damaged during a process. The liner unit 500 prevents impurities generated during the process from being deposited on the inner wall of the chamber 100 and the support unit 200. The liner unit 500 includes an inner liner 510 and an outer liner 530.

The outer liner 530 is provided on the inner wall of the chamber 100. The outer liner 530 has a space that is open at the top and the bottom. The outer liner 530 may have a hollow cylindrical shape. The outer liner 530 may have a radius corresponding to an inner surface of the chamber 100. The outer liner 530 is provided along the inner surface of the chamber 100.

The outer liner 530 may be formed of an aluminum material. The outer liner 530 protects the inner surface of the chamber 100. Arc discharge may occur inside the chamber 100 in a process in which the process gas is excited. The arc discharge causes damage to the chamber 100. The outer liner 530 protects the inner surface of the chamber 100, thereby preventing the inner surface of the chamber 100 from being damaged by the arc discharge.

The inner liner 510 is provided to surround the support unit 200. The inner liner 510 has a ring shape. The inner liner 510 is provided to surround the dielectric plate 210, the electrode plate 220, the lower cover 230, and the lower support member 240. The inner liner 510 may be formed of an aluminum material. The inner liner 510 protects an outer surface of the support unit 200.

The baffle unit 600 is located between the inner wall of the chamber 100 and the support unit 200. The baffle unit 600 has an annular ring shape. The baffle unit 600 has a plurality of through-holes formed therein. The process gas supplied into the chamber 100 passes through the through-holes of the baffle unit 600 and is released through the exhaust hole 104. The flow of the process gas may be controlled depending on the shape of the baffle unit 600 and the shape of the through-holes.

The controller 700 may control the substrate treating apparatus 10. The controller 700 may control the substrate treating apparatus 10 such that the substrate treating apparatus 10 performs a process of treating the substrate W. The controller 700 may control the substrate treating apparatus 10 such that the substrate treating apparatus 10 performs a process of treating the substrate W using plasma. For example, the controller 700 may control the substrate treating apparatus 10 such that the gas supply unit 400 supplies the process gas and the plasma source excites the gas supplied by the gas supply unit 400. Further, the controller 700 may control the lifting member 270. For example, the controller 700 may control the lifting member 270 such that the lifting member 270 vertically moves the flange 260. In addition, the controller 700 may control the lifting member 270 to adjust the distance between the upper surface of the flange 260 and the lower surface of the electrode plate 220 depending on an etch rate required for the substrate W treated by plasma. For example, when increasing the etch rate for the substrate W treated by the plasma, the controller 700 may control the lifting member 270 to increase the distance between the upper surface of the flange 260 and the lower surface of the electrode plate 220.

Figure 7:
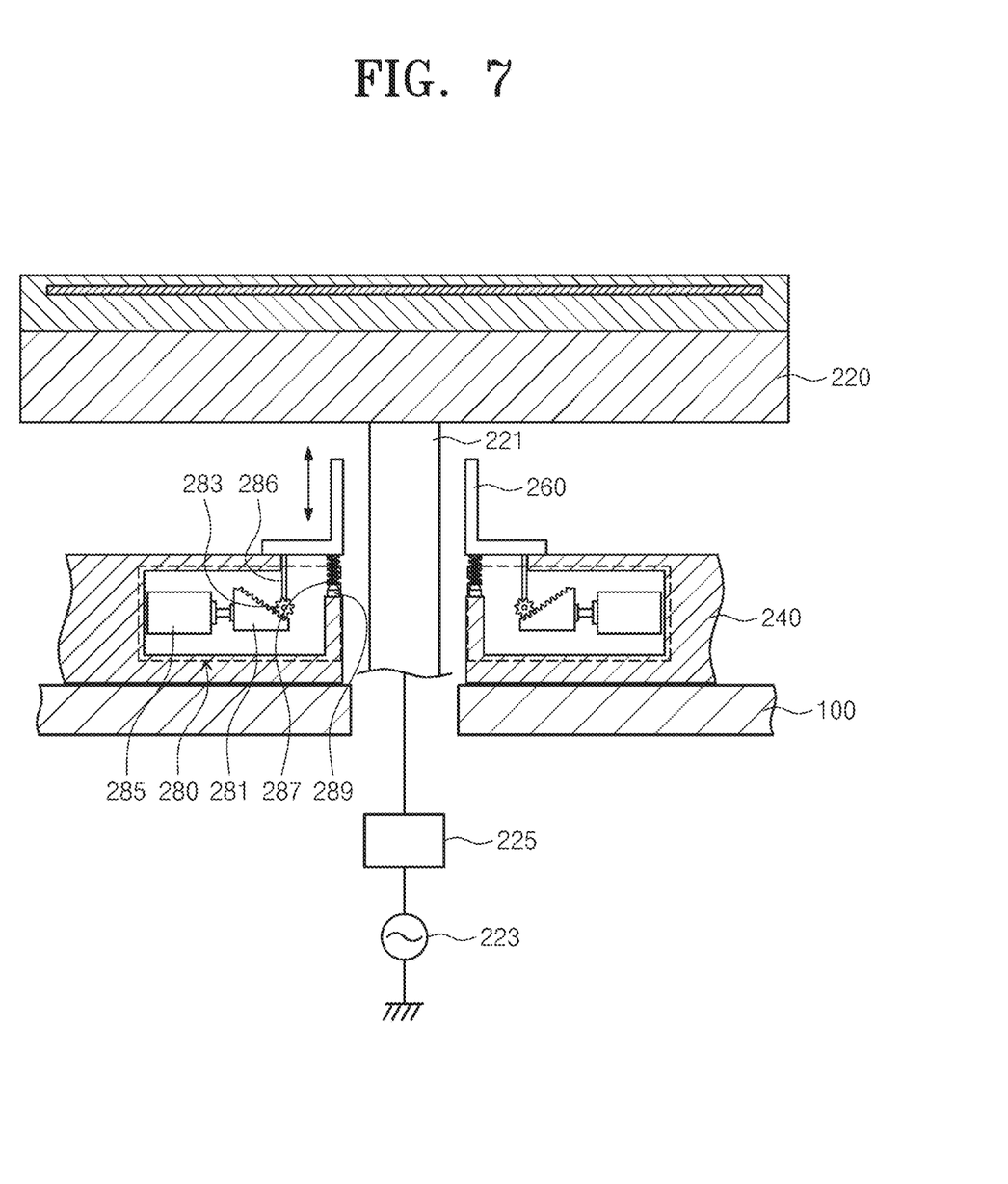
FIG. 7 is a view illustrating a lifting member according to another embodiment of the inventive concept.

FIG. 7 is a view illustrating a lifting member according to another embodiment of the inventive concept. Referring to FIG. 7, the lifting member 280 may include a rack 281, a pinion 283, an actuator 285, a lifting shaft 286, an elastic body 287, and a shock-absorbing pin 289. The rack 281 may be connected with the actuator 285. The actuator 285 may be a cylinder. The cylinder may be a cylinder that is driven by air pressure or hydraulic pressure. Without being limited thereto, however, the actuator 285 may be implemented with various well-known devices capable of moving the rack 281. The rack 281 may be connected with the actuator 285 and may move in the first direction. An upper surface of the rack 281 may have an oblique shape. The pinion 283 may be engaged with the rack 281. Furthermore, the pinion 283 may be moved in the second direction, which is different from the first direction, by the movement of the rack 281. The second direction may be a direction perpendicular to the first direction. The pinion 283 may be connected with one end of the lifting shaft 286 extending in the second direction. An opposite end of the lifting shaft 286 may be connected with the lower surface of the flange 260. When the actuator 285 moves the rack 281 in the first direction, the pinion 283 is moved in the second direction. When the pinion 283 is moved in the second direction, the lifting shaft 286 is moved in the second direction. When the lifting shaft 286 is moved in the second direction, the flange 260 may be moved in the second direction, for example, the vertical direction. The elastic body 287 and the shock-absorbing pin 289 are the same as, or similar to, the elastic body 277 and the shock-absorbing pin 279 described above. Therefore, detailed descriptions thereabout will be omitted.

Figure 8:
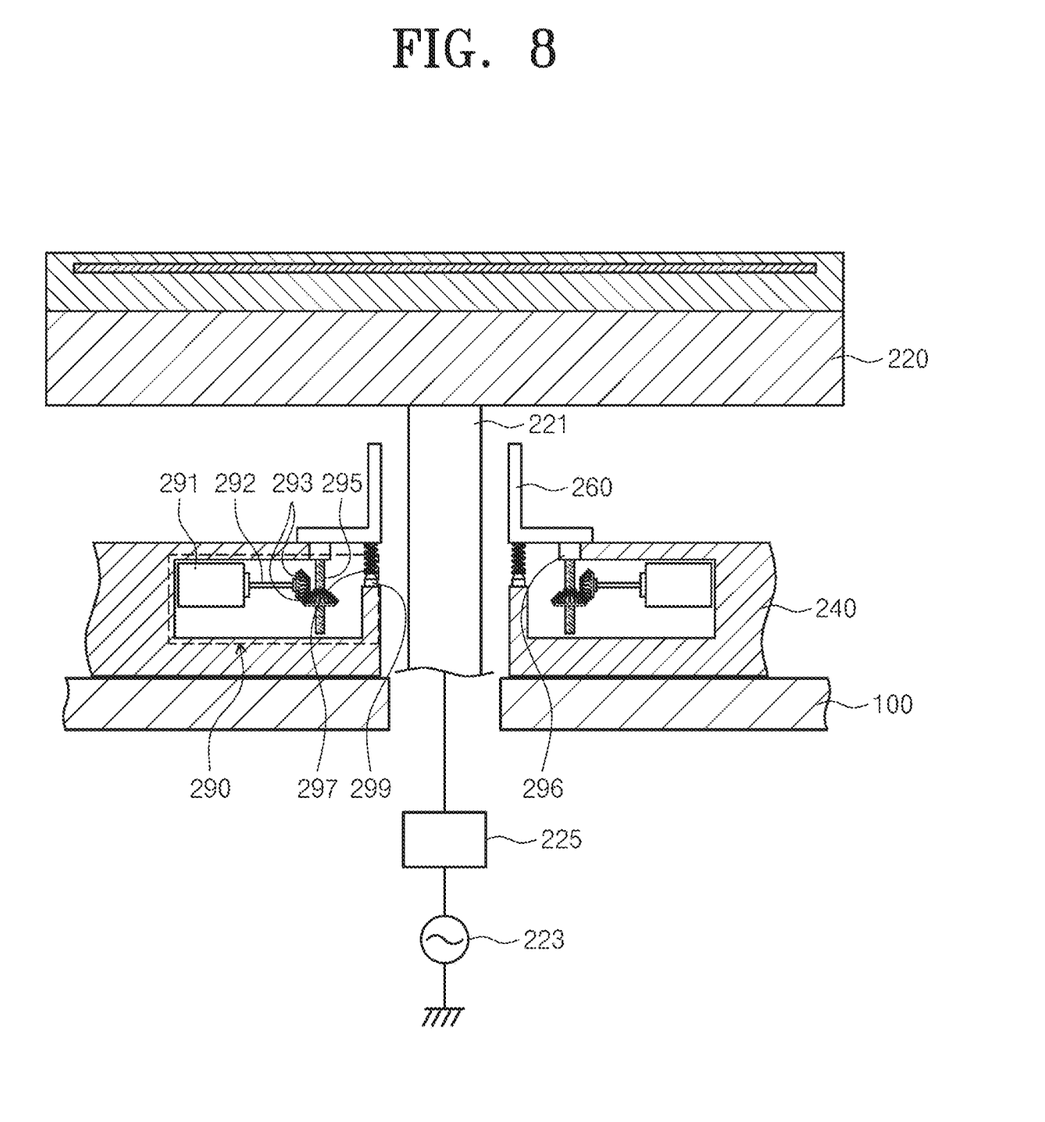
FIG. 8 is a view illustrating a lifting member according to another embodiment of the inventive concept.

FIG. 8 is a view illustrating a lifting member according to another embodiment of the inventive concept. Referring to FIG. 8, the lifting member 290 may include a motor 291, a pair of bevel gears 293, a lifting shaft 295, and a bearing 296. The motor 291 may include a drive shaft 292. The motor 291 may be a stepping motor. Without being limited thereto, however, the motor 291 may be implemented with various well-known devices. The drive shaft 292 of the motor 291 may be connected with the drive bevel gear 293. The pair of bevel gears 293 may change rotary motion of the drive shaft 292 about an axis facing in the first direction to rotary motion about an axis facing in the second direction. The second direction may be a direction perpendicular to the first direction. The lifting shaft 295 may be inserted into the driven bevel gear 293. One end of the lifting shaft 295 may be inserted into the bearing 296 provided on the lower surface of the flange 260. The lifting shaft 295 may have a thread formed on the outer circumferential surface thereof. When the motor 291 rotates the drive shaft 292, the pair of bevel gears 293 rotates. When the pair of bevel gears 293 rotates, the lifting shaft 295 inserted into the driven bevel gear 293 may be vertically moved. Accordingly, the flange 260 may be vertically moved. An elastic body 297 and a shock-absorbing pin 299 are the same as, or similar to, the elastic body 277 and the shock-absorbing pin 279 described above. Therefore, detailed descriptions thereabout will be omitted.

As described above, according to the embodiments of the inventive concept, the support unit and the substrate treating apparatus may allow a substrate to be efficiently treated.

Furthermore, the support unit and the substrate treating apparatus may minimize dispersion of an electric field in the area where the electrode plate and the power supply rod are connected with each other.

In addition, the support unit and the substrate treating apparatus may provide an additional control factor in adjusting the density of plasma generated above a substrate.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A support unit provided in an apparatus for treating a substrate using plasma, the support unit comprising:
   a dielectric plate configured to receive the substrate thereon;
   an electrode plate disposed under the dielectric plate;
   a radio frequency (RF) power supply rod configured to apply power to the electrode plate, the power supply rod extending in a vertical direction;
   a flange having a shape surrounding the power supply rod, the flange being spaced apart from the power supply rod; and
   a lifting member configured to move the flange in an up-down direction,
   wherein the flange includes a first body and a second body, the first body extending in the vertical direction and including an upper end facing the electrode plate and a lower end, and the second body extending outwardly from the lower end of the first body in a lateral direction and coupled to the lifting member,
   wherein the flange is grounded and surrounds part of the power supply rod, and
   wherein the lifting member includes an elastic body and a shock-absorbing pin, the elastic body provided on a lower surface of the flange, the shock-absorbing pin under and coupled to the elastic body, and the lifting member is configured to move the flange in the up-down direction to adjust a distance between the flange and the electrode plate.

2. The support unit of claim 1, wherein the lifting member further includes:
   a cylinder;
   a cam shaft configured to move along a first direction by a pressure applied by the cylinder; and
   a roller shaft configured to make contact with the cam shaft, the roller shaft configured to move in a second direction different from the first direction by movement of the cam shaft.

3. The support unit of claim 2, wherein the flange is coupled with the roller shaft.

4. The support unit of claim 1, wherein the lifting member includes:
   a rack connected with an actuator, the rack being movable in a first direction; and
   a pinion engaged with the rack, the pinion being movable in a second direction different from the first direction by movement of the rack.

5. The support unit of claim 4, wherein
   the lifting member further includes a lifting shaft connected to the pinion and extending in the second direction, and
   the flange is connected with the lifting shaft.

6. The support unit of claim 4, wherein the rack has a shape upwardly inclined with respect to the first direction.

7. The support unit of claim 1, wherein the lifting member includes:
   a motor including a drive shaft;
   a pair of bevel gears connected with the drive shaft; and
   a lifting shaft configured to move in the up-down direction by rotation of the pair of bevel gears.

8. The support unit of claim 1, wherein the flange has a cylindrical shape that is open at a top and a bottom.

9. The support unit of claim 1, wherein the flange is formed of a conductive material.

10. An apparatus for treating a substrate, the apparatus comprising:
    a chamber having a treatment space therein;
    a support unit configured to support the substrate in the treatment space;
    a gas supply unit configured to supply a gas into the treatment space; and
    a plasma source configured to generate plasma from the gas,
    wherein the support unit includes,
      a dielectric plate configured to receive the substrate thereon,
      an electrode plate disposed under the dielectric plate,
      a radio frequency (RF) power supply rod configured to apply power to the electrode plate, the power supply rod extending in a vertical direction,
      a flange having a shape surrounding the power supply rod, the flange being spaced apart from the power supply rod, and a lifting member configured to move the flange in an up-down direction, wherein the flange includes a first body and a second body, the first body extending in the vertical direction and including an upper end facing the electrode plate and a lower end, and the second body extending outwardly from the lower end of the first body in a lateral direction and coupled to the lifting member, wherein the flange is grounded and surrounds part of the power supply rod, and wherein the lifting member includes an elastic body, and a shock-absorbing pin, the elastic body provided on a lower surface of the flange, the shock-absorbing pin being under and coupled to the elastic body, and the lifting member is configured to move the flange in the up-down direction to adjust a distance between the flange and the electrode plate.

11. The apparatus of claim 10, wherein
the chamber is grounded, and
the flange is electrically connected with the chamber.

12. The apparatus of claim 11, wherein the chamber and the flange are formed of a conductive material.

13. The apparatus of claim 10, wherein
the apparatus further comprises a controller configured to control the support unit, and
the controller is configured to control the lifting member to adjust the distance between an upper surface of the flange and a lower surface of the electrode plate depending on an etch rate desired for the substrate treated by the plasma.

14. The apparatus of claim 13, wherein when increasing the etch rate for the substrate treated by the plasma, the controller is configured to control the lifting member to increase the distance between the upper surface of the flange and the lower surface of the electrode plate.

15. The apparatus of claim 10, wherein the flange is formed of a conductive material.

* * * * *